United States Patent
Roy et al.

(10) Patent No.: US 9,786,855 B2
(45) Date of Patent: Oct. 10, 2017

(54) MICRO ELECTRO MECHANICAL SYSTEM (MEMS) BASED WIDE-BAND POLYMER PHOTO-DETECTOR

(71) Applicant: Indian Institute of Technology Bombay, Powai, Mumbai, Maharashtra (IN)

(72) Inventors: Sangita Chaki Roy, Mumbai (IN); Tapanendu Kundu, Mumbai (IN); V. Ramgopal Rao, Mumbai (IN)

(73) Assignee: Indian Institute of Technology Bombay, Mumbai (IN)

( * ) Notice: Subject to any disclaimer, the term of this patent is extended or adjusted under 35 U.S.C. 154(b) by 0 days.

(21) Appl. No.: 14/980,540

(22) Filed: Dec. 28, 2015

(65) Prior Publication Data

US 2016/0211475 A1    Jul. 21, 2016

(30) Foreign Application Priority Data

Dec. 30, 2014    (IN) .......................... 4235/MUM/2014

(51) Int. Cl.
*H01L 51/42*    (2006.01)
*H01L 51/00*    (2006.01)

(52) U.S. Cl.
CPC ........ *H01L 51/4206* (2013.01); *H01L 51/002* (2013.01); *H01L 51/004* (2013.01); *Y02E 10/549* (2013.01)

(58) Field of Classification Search
None
See application file for complete search history.

(56) References Cited

U.S. PATENT DOCUMENTS

| 6,670,213 B2 | 12/2003 | Halls et al. |
| 2008/0017845 A1* | 1/2008 | Drndic ............... B82B 3/00 257/24 |
| 2013/0248822 A1 | 9/2013 | Gong |

(Continued)

FOREIGN PATENT DOCUMENTS

| CN | 1869612 A | 11/2006 |
| CN | 101275867 A | 10/2008 |
| IT | TO2012A000826 | 9/2014 |

(Continued)

*Primary Examiner* — Jay C Chang
(74) *Attorney, Agent, or Firm* — Pepper Hamilton LLP (57) ABSTRACT

A polymer based photo-detector has photoresponsivity in Ultraviolet, Visible, Near and Mid Infrared regions. The photo-detector comprises a single layer of polyvinyl alcohol (PVA) as a photoactive layer; with no additional buffer layer for accepting Ultraviolet, Visible and Infrared radiation as well as no buffer layer to block charge carrier injection. The PVA layer's photoresponsivity is extended from Ultraviolet to Near Infrared by changing its nano-morphology on a low thermal device structure. The primarily photo-generated charge carriers diffuse through the amorphous part of the polymer layer and split into charge carriers on the electrodes or by the charge traps in the layer. The charge carrier generation is in the picosecond range; thus the exciton and Polaron drift diffusion cause electrical conduction of the polymer layer under Ultraviolet illumination. The low thermal mass of the MEMS based structure reduces localized heating effect due to Infrared radiation, increasing responsivity of the photo-detector.

6 Claims, 7 Drawing Sheets

(56) References Cited

U.S. PATENT DOCUMENTS

2014/0001455 A1 1/2014 Holmes et al.
2017/0023406 A1* 1/2017 Kaufman .................. G01J 1/44

FOREIGN PATENT DOCUMENTS

| WO | 99/09603 A1 | 2/1999 |
| WO | 03/065416 A2 | 8/2003 |
| WO | 2010/077710 A2 | 7/2010 |

* cited by examiner

MICRO ELECTRO MECHANICAL SYSTEM (MEMS) BASED WIDE-BAND POLYMER PHOTO-DETECTOR

CROSS REFERENCE TO RELATED APPLICATIONS

This application claims priority to Indian Patent Application No. 4235/MUM/2014, filed Dec. 30, 2014, the entire contents of which is hereby incorporated by reference herein.

FIELD OF INVENTION

The present invention relates generally to a polymer photo-detector and, more specifically, to a micro electro mechanical system (MEMS) based photo-detector comprising a single photoactive layer with wide-band (Ultra Violet, Visible to Infrared) photo detection having photoconductive and pyroelectric measurement capability.

BACKGROUND

Polymer photo-detectors are sought after for the purpose of photo-detection and measurement of photoconductivity and pyroelectric characteristics due to their low-cost and simple fabrication capability. Traditional silicon photo-detectors absorb only below 1.1 µm, which means that they can only be operated within visible waveband and Near Infrared, hence having limited applicability. Further, the aging of device and radiation effects further lower its Quantum efficiency.

The existing prior art explains the method for manufacturing photo-responsive devices as well as broadband photo-detectors. They all include devices comprising a number of layers fabricated onto one another. These multiple depositions are provided for enhancing and blocking the charge carriers for photoconduction. The multiple layers make the device bulky as well as expensive.

In U.S. Pat. No. 6,670,213 B2, titled "Method of Preparing Photoresponsive Devices, and Devices Made Thereby," a method of preparing a photoresponsive device is explained which includes fabricating a first electrode on a substrate, forming a layer of an organic material including a blend of at least two semiconducting polymers having different electrode affinities and/or different ionization potentials over the first electrode, and providing a second electrode over the layer of organic material. The method requires at least one of the electrodes as transparent or semi-transparent, to form a photo responsive device, and thermally anneals the photo responsive device. It requires two semiconducting polymers for operation in broadband.

US Patent Publication No. 2013/0248822 A1, titled "Broadband Polymer Photodetectors Using Zinc Oxide Nanowire as an Electron-Transporting Layer," describes a semiconductor polymer thin-film based photodetector with enhanced spectrum and fast temporal response having inverted type structure. It includes an indium-tin-oxide (ITO) as cathode and anode that is separated with a sandwiched photoactive layer of PDDTT and PCBM formed with a composite of conjugated polymers. Also, a cathode buffer layer formed as a matrix of Zinc Oxide (ZnO) nanowires is disposed upon the ITO cathode, while a MoO3 anode buffer layer is disposed between a high work-function metal anode and the active layer. The extraction of charge carriers and blocking of holes are done by ZnO nanowires. There are multiple depositions for enhancing and blocking the charge carriers for photoconduction. The multiple layers decrease the cost effectiveness of the photodetector.

In view of the foregoing, there is a need for a simple photo-detector with low-cost photoactive polymer with a simplified single layer deposition and easy fabrication for multi-wave band response. In addition, there is a need for a miniaturized photo-detector with low thermal mass and adaptability for any kind of detection system.

OBJECT OF THE INVENTION

It is the primary object of the present disclosure to provide a MEMS based polymer photo-detector.

It is another object of the present disclosure to provide a simple deposition technique for the polymer photo-detector device without multiple layer stacks, with a low-cost fabrication process.

It is another object of the present disclosure to provide a MEMS based polymer photo-detector, which is miniaturized, to use or adapted to be used in any kind of detection system such as "lab-on-a-chip type" systems.

It is another object of the present disclosure to provide a MEMS based photo-detector having low thermal mass of the active layer of the polymer photo-detector.

It is another object of the present disclosure to provide a single polymer photoactive layer having photoconductivity and pyroelectricity in the same polymer layer.

SUMMARY

An embodiment of the present disclosure discloses a single polymer photo-detector device having wideband spectrum responsivity. To achieve the spectrum responsivity in different wavebands, different dominating properties of different electromagnetic regions of those wavebands are required to be merged on a single device. The current disclosure presents a novel MEMS based photo-detector device wherein the photo-detection capability of the polymer is extended to multiple wavebands, from Ultraviolet, Visible to Infra-red by changing the nano-morphology of the single photoactive layer on a low thermal mass device structure. The photoconductivity and pyroelectric properties of the photoactive material are merged by changing the nano-morphology of the photoactive layer. In an embodiment, the polymer used as the photoactive layer is Polyvinyl Alcohol (PVA), which has excellent capabilities of easy synthesis, low cost, flexible fabrication on different substrates, long term stability, bio-compatibility, and its distinct characteristics include photoconductivity and pyroelectricity.

The variations in the nano-morphology of the photoactive polymer PVA layer is achieved by varying a thickness and a concentration of the photoactive polymer PVA layer. The thickness ranges from 350 nm to 50 micron, and the thickness of the photoactive polymer PVA layer is kept greater than the penetration depth of Visible photons and the thickness of the photoactive polymer PVA layer is kept in the same range as that of the penetration depth of Infrared radiation. The concentration is varied by doping the photoactive polymer PVA layer.

A novel feature of the invention is the development of a miniaturized MEMS based single photoactive layer photoconductive polymer on a low thermal mass platform with photoresponsitivity spanning from Ultraviolet, Visible to Infra-red. There is no additional buffer layer for accepting Ultraviolet, visible and Infrared radiation as well as buffer layer to block the charge carrier injection. The fabricated photo-detector is a miniaturized MEMS device which has the potential to be integrated in any lab-on-a-chip system, particularly useful in micro-fluidic and biological sensing. The low thermal mass of the MEMS based structure reduces the effect of localized heating due to Infrared radiation, thereby increasing responsivity of the photo-detector.

The semi-crystalline nature of the PVA polymer is used for a photo generation process in the polymer when illuminated in the UV-Visible region. Due to localized heating by IR radiation, the pyroelectric properties of PVA polymer become dominant in IR region.

The photocurrent variation can be accredited to the fact that thickness of the polymer photoactive PVA layer determines the electric field intensity (E=U/d) as well as the extent of absorbed light in the photoactive layer. The absorption co-efficient decreases with increasing photoactive layer thickness. The photoresponsivity of the single layer photoactive polymer is also dependent on the concentration of the PVA polymer in the layer.

In UV-visible region the photoconductivity is achieved through primary charge carrier excitons, and in Infrared region the vibrational spectroscopy is achieved using pyroelectric properties of the photoactive PVA polymer. The photo-detector exhibited maximum responsivity of 0.53 A/W at 240 nW of power and maximum detection ability of $3.172 \times 10^{12}$ Jones at 470 nm wavelength with 240 nW of power. The minimum response time of 500 ns was observed when excited with 7 ns pulsed laser. The MEMS based photo-detector relaxes the necessity of using different photo-detectors for different wavebands and is acceptable for developing lab-on-chip systems.

DETAILED DESCRIPTION OF THE INVENTION

The present disclosure relates to a polymer photo-detector comprising a single photoactive Polyvinyl Alcohol (PVA) polymer layer having wideband (Ultraviolet-Visible to Infra-red) photo-detection as well as photoconductive and pyroelectric capability. The following description with reference to accompanying drawings is presented to enable one of ordinary skill in the art to make and use the invention and is provided in the context of patent application and its requirements.

Figure 1:
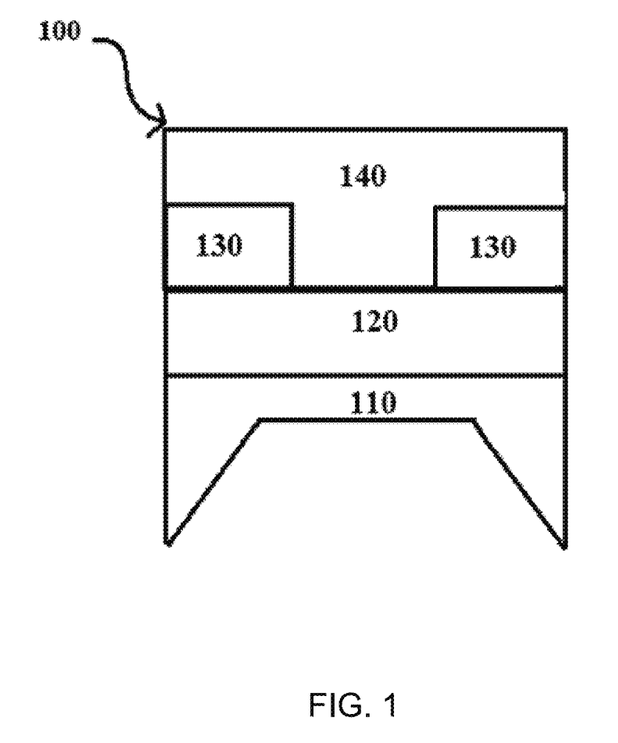
FIG. 1 is a schematic layout depicting structure, in accordance with an aspect of the present disclosure.

As illustrated in FIG. 1, according to an embodiment, a MEMS based photo-detector device 100 includes a Silicon substrate 110 (a p-type or n-type substrate); an insulating $SiO_2$ layer 120; and a single photoactive Polyvinyl Alcohol (PVA) layer 140 between metal electrodes of Gold 130. The photo-detector is illuminated in the Ultraviolet-Visible light, and charge carriers (singlet excitons, Polarons, and Polaron pairs) are produced in the polymer film. The Exciton generation mechanism is not dominant under low light intensity and zero electric field condition.

The amorphous part of the polymer layer 140 is irregular with presence of many trap sites in it, and the dipoles usually orient themselves in different equilibrium positions. The primarily photo-generated (Polarons, Polaron pair, and singlet excitons) charge carriers diffuse through the amorphous part of the polymer layer 140 and split into charge carriers on the electrodes 130 or by the charge traps (defects/impurities) in the layer. The charge carriers generation is in the picosecond range, and thus the exciton diffusion and Polaron drift diffusion are the main reasons for electrical conduction of the polymer layer 140 under Ultraviolet (UV) illumination.

Figure 2:
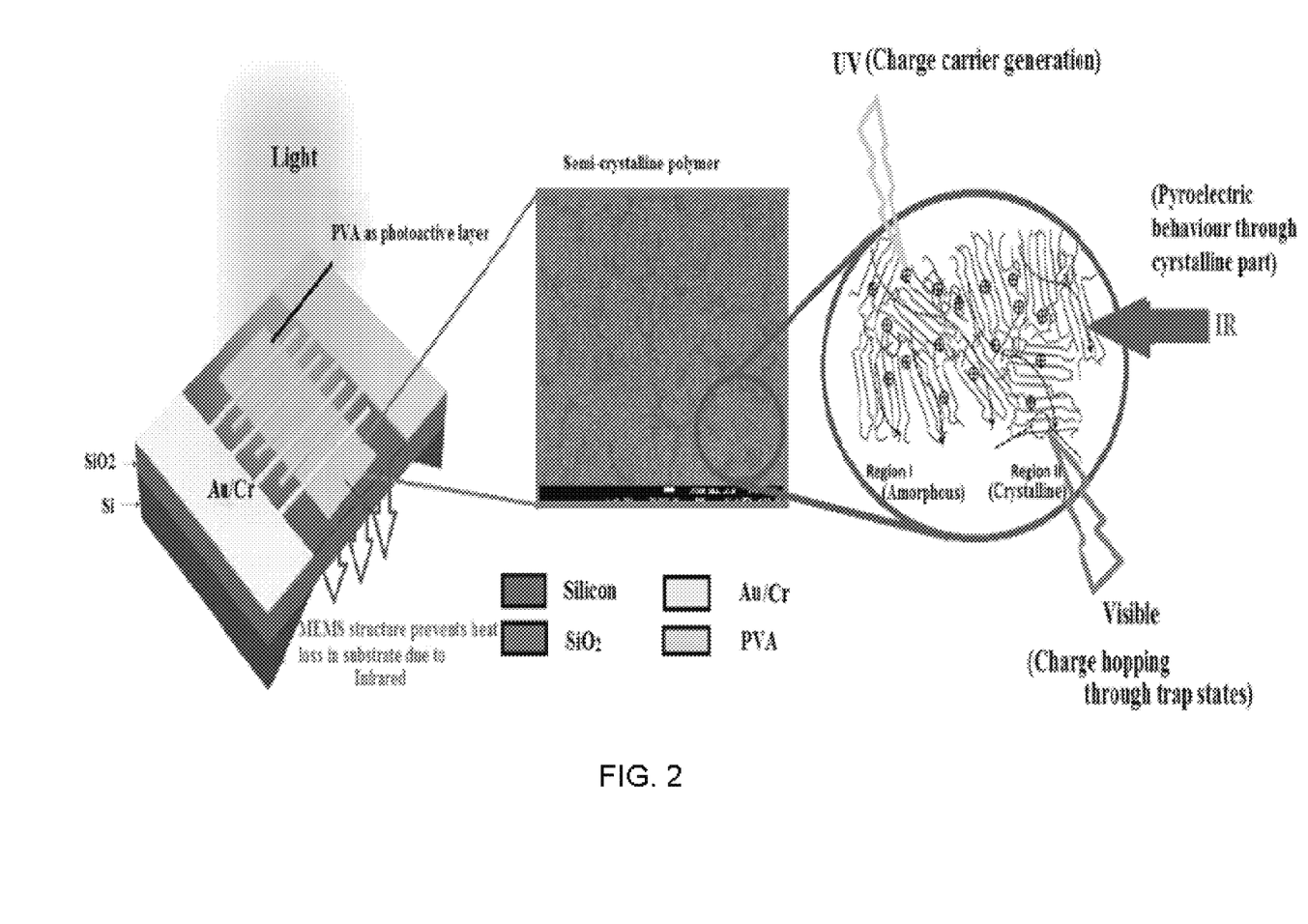
FIGS. 2 and 2A are schematic illustrations of a MEMS based wideband photo-detector, in accordance with an aspect of the present disclosure.
Figure 2A:
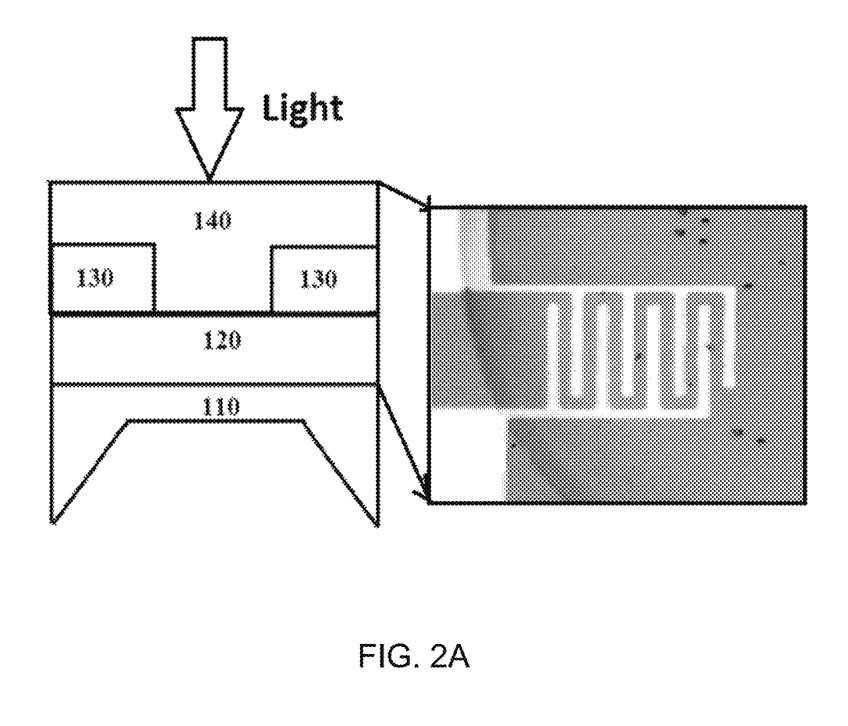

FIGS. 2 and 2A are schematic illustrations of one of the embodiments of the present disclosure, depicting a MEMS based wideband photo-detector spanning from Ultraviolet, Visible to Infrared region. The photo-detector reduces the complexity of instrumentations of optoelectronic devices as separate detectors are being used for different wavebands. The photoresponse of the photoactive polymer begins with the absorption of the light photons. The generations of primary and secondary excitons depend on the wavelength of incident light. Photoactive PVA polymer layer thickness is decided depending upon the penetration depth of Ultraviolet-Visible photons or infrared (near (850 nm-2500 nm) or mid (6 micron-12 micron)) radiation.

For photo-detector's response in the Ultraviolet-Visible and infrared regions of the electromagnetic spectrum, the thickness of the photoactive PVA polymer layer between the metal electrodes should be, according to an embodiment, greater than the Ultraviolet-Visible photon penetration depth but less than Infrared (IR) radiation penetration depth. The charge carriers diffuse from the metal electrode on absorption of visible photons near electrodes, whereas due to the comparable penetration depth to film thickness, the IR photons are easily absorbed near the metal electrodes.

In the Infrared (IR) region, the absorption of IR radiation leads to localized heating of the photoactive PVA polymer layer through non-radiative path, leading to rise in temperature. As the temperature rises, the mobility of the dipoles increases within the polymeric region. The dipoles gain energy to orient themselves in the direction of applied electric field. This change in dipoles orientation leads to change in pyroelectric current. In order to reduce the passing of generated local heat into the silicon substrate of the device, the silicon substrate is kept thinner. The MEMS based structure, according to embodiments provided herein, is the solution to the heat loss problem.

The photoresponsivity of photoactive PVA polymer layer is widened to visible region light photons by generation of additional trap state charge carriers. The trap states have continuous distribution at the metal-polymer interface. The conductive impurities reside at boundary between amorphous and crystalline part of said photoactive PVA polymer layer and diffuse through the amorphous region of said photoactive PVA polymer layer and makes a charge transport within said photoactive PVA polymer region by hopping from one site to neighboring site by lowering of potential barrier at the interfaces. The polymeric region near the electrode experiences the motion of space charges and trap states through which the charge carriers, generated by the visible light illumination, travels. For the visible light illumination, hopping conduction is the conduction mechanism.

Figure 3:
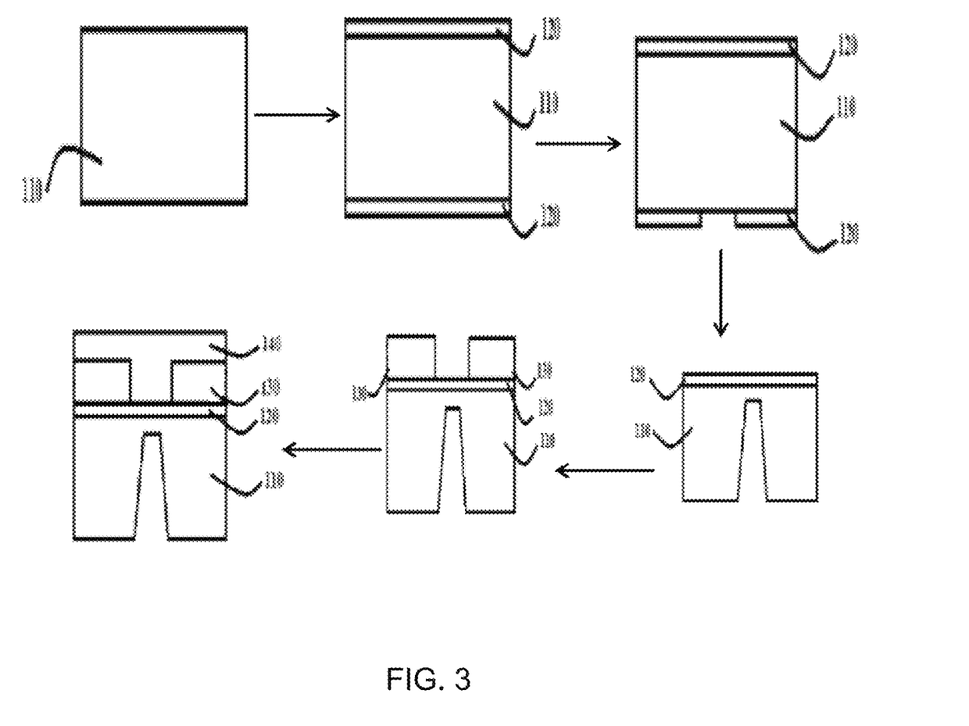
FIG. 3 is a schematic illustration showing a step-by-step process of fabricating a polymer MEMS photo-detector, in accordance with an aspect of the present disclosure.
Figure 4:
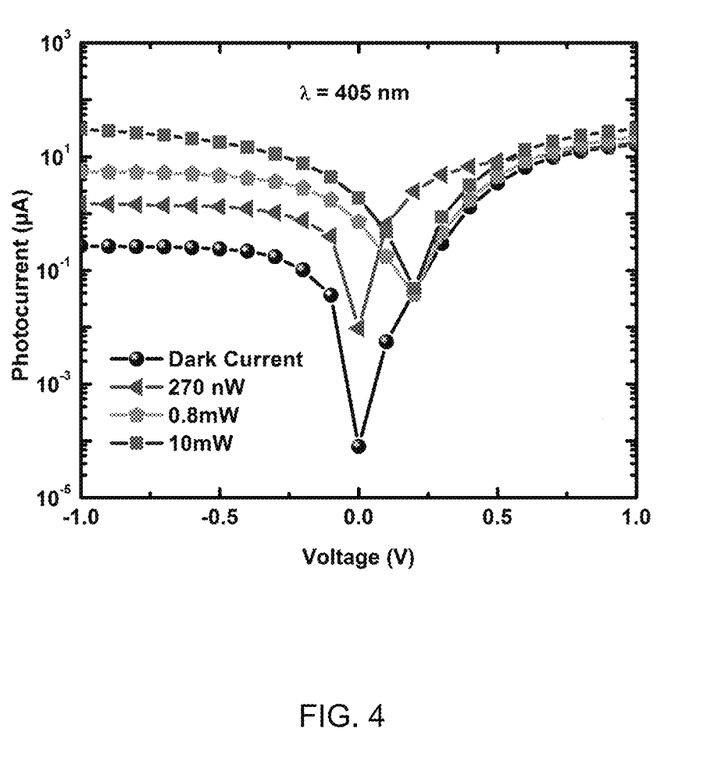
FIG. 4 is a graphic depicting aspects of a MEMS photo-detector, in accordance with an aspect of the present disclosure.

FIG. 3 shows a process for fabrication of polymer MEMS based photo-detector 100 fabricated with Metal-Semiconductor-Metal (MSM) design, according to an embodiment. The fabrication procedure starts with RCA cleaning of the p-type double-side polished Silicon wafer substrate 110. The cleaned substrate wafer is immediately placed in a wet oxidation furnace for growing of 500 nm Silicon dioxide ($SiO_2$) 120 at or near 1100° C. The substrate thickness plays a very crucial role in increasing the photoresponsivity of the material as a thermal sensor. In an effort to suspend the thin layer from three sides and decrease the heat loss to the substrate 110, the structure is, according to an embodiment, made of Silicon. The $SiO_2$ layer 120, which acts as an insulating layer, is patterned on sides of the double sided wafer, creating a back-side window. After developing the cavity structure, $SiO_2$ layer 120 is removed from the said cavity by Buffered Hydroflouride (BHF) (5:1) chemical, according to an embodiment. An anisotropic etchant Tetramethyl ammonium hydroxide (TMAH) 25% by weight is used to form the diaphragm bridge structure by etching the Silicon from the bottom side of the MEMS device. The silicon dioxide $SiO_2$ layer 120 on the other side is patterned by lithography and etched by BHF (5:1) chemical with etching rate around 60-70 nm/min. On this patterned Si/SiO2 structure a 100 nm thin layer of gold (Au) 130 is deposited by a thermal evaporation method. As is evident from the second and third steps, the $SiO_2$ layer is kept for protection of substrate from etching process. After etching, the said $SiO_2$ layer is removed as shown in fourth, fifth and sixth step in the FIG. 3. The deposited gold layer 130 is then patterned. Therefore, the main design aspect of the Polymer MEMS sensor structure contains Metal-Semiconducting-Metal (MSM) formation. All the charge carriers stream through the photoactive PVA polymer layer 140. A groove is in a bottom surface of the substrate FIG. 4 is a graphic depicting aspects of a MEMS photo-detector, in accordance with an aspect of the present disclosure. In particular, FIG. 4 is a magnitude of current verse voltage plot (Voltage-Photocurrent plot) of a wideband PVA MEMS photo-detector in the dark and under three different light intensities at λ=470 nm. Under illumination, forward and reverse currents are increased with increasing illumination. On exposure to 270 nW of optical power at λ=470 nm, it is observed that there is one order of magnitude increase in photocurrent, which increases to three order of magnitude at 10 mW of optical power. At zero bias, on absorption of photons of particular wavelength from light source, the primary photo-generated charge carriers flow between the metal electrode. The electrons generated in Highest Occupied Molecular Orbital (HOMO) of the PVA polymer layer tend to move away from the electrode, whereas the holes in the Lowest Unoccupied Molecular Orbital (LUMO) of the PVA polymer layer incline to move more proximate to the interface. Thus, the barrier height is lowered by these accumulated holes at the metal-polymer interface. On applying bias voltage, the charge carriers generated by photons start moving towards their respective electrodes. The intensity of electric field increases considerably due to which additional charge carriers are swept from the trap states. These additional charge carriers move by a hopping process from polymer PVA layer to metal, increasing the photocurrent. The photocurrent of the photo-detector is directly related to the influx of photons. Therefore, the photocurrent increases in the photo-detector with increase in the light intensity. Further, responsivity is dependent on bias voltage; therefore, with increase in bias voltage the responsivity increases sharply (up to 0.6 V of bias voltage), and thereafter it starts saturating.

Figure 5:
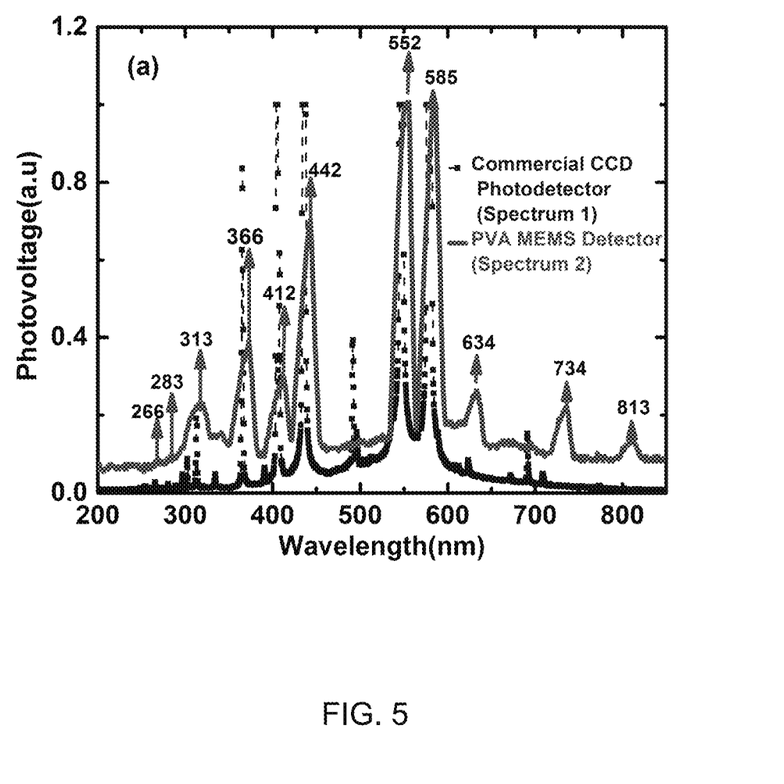
FIG. 5 is another graphic depicting aspects of a photo-detector device, in accordance with an aspect of the present disclosure.

FIG. 5 shows a Wavelength-Photovoltage (photoresponsivity) plot spanning from Ultraviolet, Visible to Infra-red of the photo-detector device, according to an embodiment. More particularly, the spectral response of the MEMS based photo-detector in broad spectral coverage from 200 to 850 nm is as shown in FIG. 5, and 1525 to 1575 nm (UV to Near-IR) is as shown in the inset of FIG. 5. The wavelength response of the MEMS based photo-detector is compared with a commercially available CCD photo-detector (Ocean optics). The spectrum (wavelength as well as intensity) of the Ultraviolet enhanced Mercury lamp profile can be reproduced using a MEMS based photo-detector disclosed herein. The inset of FIG. 5 is the response of a MEMS based photo-detector in the Near IR region (1525-1575 nm) with 500 µW power. The variation of the source power with wavelength is reproduced by a MEMS based photo-detector.

Figure 6:
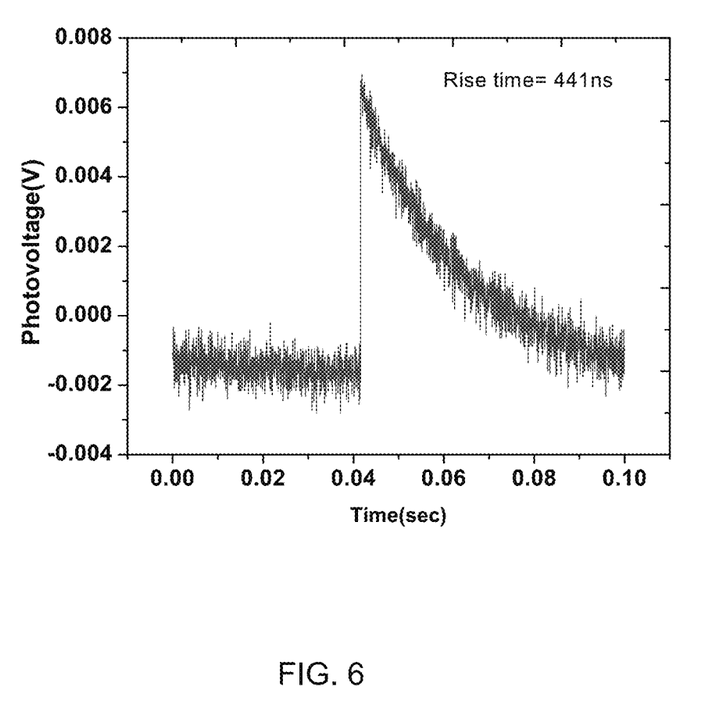
FIG. 6 is a graphic illustrating a time response of a MEMS photo-detector, in accordance with an aspect of the present disclosure.

FIG. 6 shows a transient time response of the MEMS photo-detector, according to embodiments provided herein, with Nd:Yag laser (532 nm wavelength) and a pulse of 5-7 ns. For many communication applications, the rise time and decay time is important since it determines the photo-detector's capability to synchronize the frames of the detector array modules of the communication systems. The rise time is defined as the time taken by the photo-detector to change the output signal from 10% to 90%; and the decay time is the time taken by the photo-detector to reach 10% of the signal when the optical source is switched off. The rise time of the PVA photo-detector with Nd:Yag laser is measured to be 441 ns and the decay time is 70 ms. The response time of the MEMS based PVA polymer photo-detector, in accordance with embodiments provided herein, strongly suggests that the photo-detector response time depends on number of photons available.

Although the present invention has been described with reference to exemplary embodiments, it is not limited thereto. Those skilled in the art will appreciate that numerous changes and modifications may be made to the preferred embodiments of the invention and that such changes and modifications may be made without departing from the true spirit of the invention. It is therefore intended that the appended claims be construed to cover all such equivalent variations as fall within the true spirit and scope of the invention.

We claim:

1. A polymer based miniaturized wideband photo-detector comprising:
   one of a p-type or n-type substrate of Silicon (Si);
   an insulating layer of Silicon dioxide (SiO2) deposited over the substrate;
   at least one metal electrode deposited over the insulating layer; and
   a single photoactive layer of an organic polymer deposited between two portions of said at least one metal electrode;
   wherein the photo-detector comprises a micro electro mechanical system (MEMS) bridge diaphragm structure closed from a top surface and comprises a groove in a bottom surface of said substrate.

2. The polymer based miniaturized wideband photo-detector as claimed in claim 1, wherein said at least one metal electrode is deposited on top of said insulating layer of SiO2 at two sides, wherein said metal electrode comprises Gold (Au).

3. The polymer based miniaturized wideband photo-detector as claimed in claim 1, wherein said photoactive layer of organic polymer is deposited between two portions of said at least one metal electrode, wherein said organic polymer comprises semi-crystalline polyvinyl alcohol (PVA) having photoresponsivity in wide-band regions comprising Ultraviolet, Visible, Near Infrared, and Mid Infrared regions.

4. The polymer based miniaturized wideband photo-detector as claimed in claim 1, wherein said photo-detector exhibits photoresponsivity in multi-band regions comprising Ultraviolet, Visible, Near Infrared (850 nm-2500 nm) and Mid Infrared (6 micron-12 micron) regions of Electromagnetic Spectrum by varying nano-morphology of said photoactive layer of organic polymer.

5. The polymer based miniaturized wideband photo-detector as claimed in claim 4, wherein said variations in the nano-morphology of said photoactive layer of organic polymer is achieved by varying a thickness and a concentration of said photoactive layer of organic polymer, wherein said thickness ranges from 350 nm to 50 micron, wherein said thickness of said photoactive layer of organic polymer is kept greater than a penetration depth of Visible photons and said thickness of said photoactive layer of organic polymer is kept in the same range as that of a penetration depth of Infrared radiation, and wherein said concentration is varied by doping the said photoactive polymer PVA layer.

6. The polymer based miniaturized wideband photo-detector as claimed in claim 1, wherein said photo-detector comprises electrical and optical response characteristics due to a semi-crystalline nature of said photoactive layer of organic polymer, leading to photoconductive and pyroelectric properties and effects of variations in nano-morphology of said photoactive layer of organic polymer.

* * * * *